United States Patent
Inomoto

(12)
(10) Patent No.: US 6,228,671 B1
(45) Date of Patent: May 8, 2001

(54) PROCESS FOR PRODUCTION OF SEMICONDUCTOR LASER GRATING

(75) Inventor: Yasumasa Inomoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/315,966

(22) Filed: May 21, 1999

(30) Foreign Application Priority Data

Jun. 10, 1998 (JP) .................................................. 10-162298

(51) Int. Cl.$^7$ .................................................. H01L 21/00
(52) U.S. Cl. .................................................. 438/32
(58) Field of Search .................................. 438/29, 31, 32, 438/40, 43; 372/43, 44, 45

(56) References Cited

U.S. PATENT DOCUMENTS

| | | | |
|---|---|---|---|
| 5,329,542 | * 7/1994 | Westbrook | 372/96 |
| 5,668,047 | * 9/1997 | Muroya | 438/31 |

FOREIGN PATENT DOCUMENTS

| | | |
|---|---|---|
| 2-244691 | 9/1990 | (JP) . |
| 4-303982 | 10/1992 | (JP) . |
| 6-69605 | 3/1994 | (JP) . |
| 6-314657 | 11/1994 | (JP) . |
| 6-338658 | 12/1994 | (JP) . |
| 7-240559 | 9/1995 | (JP) . |
| 8-153928 | 6/1996 | (JP) . |
| 8-255954 | 10/1996 | (JP) . |
| 9-189805 | 7/1997 | (JP) . |
| 11-67721 | 3/1999 | (JP) . |

OTHER PUBLICATIONS

T. Nishida et al., "Microloading Effect in InP Wet Etching", pp. 2414–2421, J. Electrochem, Soc., vol. 140, No. 8, Aug. 1993.

* cited by examiner

Primary Examiner—Charles Bowers
Assistant Examiner—Keith Christianson
(74) Attorney, Agent, or Firm—Young & Thompson

(57) ABSTRACT

A resist pattern for formation of diffraction grating is formed on a semiconductor substrate so that the area of each aperture of diffraction grating increases gradually toward the end of diffraction grating formation region, after which etching is conducted to produce a diffraction grating substrate. On the diffraction grating substrate are formed a guide layer, an active layer and a clad layer, whereby a semiconductor laser partially having a diffraction grating is produced.

14 Claims, 11 Drawing Sheets

PROCESS FOR PRODUCTION OF SEMICONDUCTOR LASER GRATING

BACKGROUND OF THE INVENTION

1. Field of the Invention

The present invention relates to a process for producing a diffraction grating substrate for a semiconductor laser partially having a diffraction grating, by electron beam exposure or the like, as well as to a process for producing a semiconductor laser partially having a diffraction grating, using the above diffraction grating substrate.

2. Description of the Prior Art

In production of a semiconductor laser having a diffraction grating, it is one of the most important factors in ensuring the satisfactory performance and yield of the semiconductor laser to precisely control the diffraction grating shape of the diffraction grating substrate used in the semiconductor laser. In order to attain the precise control, it is conducted to form, on a semiconductor substrate by electron beam exposure (hereinafter referred to as EB exposure), a fine resist pattern of diffraction grating having precisely controlled aperture intervals. And then the semiconductor substrate is etched to transfer the resist pattern onto the substrate. In this case, formation of a diffraction grating pattern on the whole surface of a wafer by EB exposure takes an enormous exposure time; therefore, it is ordinarily conducted to form a diffraction grating pattern on part of a wafer and only the pattern region is subjected to EB exposure to form an aperture pattern.

FIG. 13 is a schematic drawing of a diffraction grating substrate in which a diffraction grating has been formed by a conventional process. This structure is formed as follows. A resist 305 is coated on a semiconductor substrate 302; at part of the coated resist, a resist pattern 301 for formation of diffraction grating is formed; then, wet etching is conducted to form a diffraction grating. As shown in FIG. 13, when the resist pattern is a repetition of an aperture of given area, the etching rate become larger in the vicinity of the end 303 of resist pattern formation region owing to a pattern effect; as a result, overetched hollowing 304 of diffraction grating takes place in the vicinity of said end, making it impossible to form a diffraction grating of uniform shape.

In a semiconductor laser partially having such a diffraction grating of nonuniform shape, there occur, at the end of diffraction grating formation region, light reflection and scattering caused by the overetched hollowing of diffraction grating, and which brings on laser beam waveguide loss and nonuniform field distribution.

SUMMARY OF THE INVENTION

The present invention aims at providing a process for producing a semiconductor substrate having a diffraction grating of uniform shape by suppressing the overetched hollowing of diffraction grating, and a process for producing a semiconductor laser partially having a diffraction grating by using the above semiconductor substrate.

The present invention relates to a process for producing a diffraction grating substrate for a semiconductor laser partially having a diffraction grating, which process comprises:

a resist patterning step of forming a resist pattern for formation of diffraction grating on a semiconductor substrate so that the aperture area of diffraction grating increases gradually toward the end of diffraction grating formation region, and an etching step of conducting etching using said resist pattern to form a diffraction grating at the surface of the semiconductor substrate.

The present invention further relates to a process for producing a semiconductor laser partially having a diffraction grating, which comprises a step of forming, on the diffraction grating substrate produced by the above process, a guide layer, an active layer and a clad layer in this order.

The present inventor made a study on the relation between resist pattern and overetched hollowing of diffraction grating and, as a result, found out that particularly in wet etching, an etching solution remains easily at the end of diffraction grating formation region and the overetched hollowing of diffraction grating takes place at said end. Specifically explaining, the consumption rate of etching solution is constant at the region where the resist pattern is formed at constant aperture intervals; however, at the end of diffraction grating formation region, the area to be etched decreases suddenly, the consumption rate of etching solution decreases as well (a pattern effect), as a result, the etching solution remains at said end. Therefore, by gradually increasing the area of each aperture of resist pattern towards the end of diffraction grating formation region, the consumption rate of etching solution can be made substantially the same between the end of diffraction grating formation region and the other inner part of diffraction grating formation region, whereby the remaining of etching solution at said end can be prevented and a diffraction grating of uniform shape can be obtained.

Thus, according to the present invention, by forming a resist pattern for formation of diffraction grating so that the area of each aperture of diffraction grating increases gradually at the end of diffraction grating formation region, it is possible to suppress a rise in etching rate which takes place in a wet etching step owing to a pattern effect at the end of diffraction grating formation region. As a result, there can be provided a process for producing a semiconductor laser partially having a diffraction grating, which semiconductor laser causes neither laser beam waveguide loss nor nonuniform field distribution.

DETAILED DESCRIPTION OF THE PREFERRED EMBODIMENTS

EXAMPLE 1

Steps for production of a DFB laser with a field absorption type modulator as an example of the present invention are shown in FIGS. 1 to 6.

Figure 1:
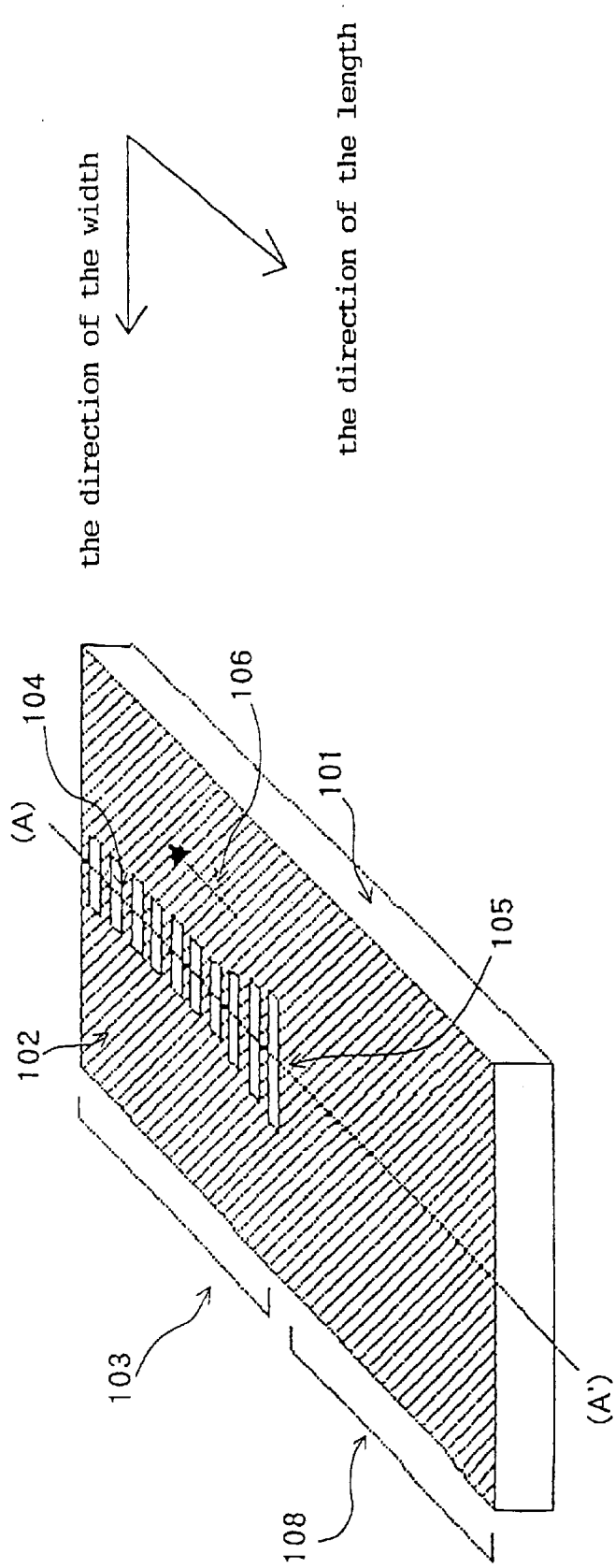
FIG. 1 is a drawing showing a step employed in production of a DFB laser with a field absorption type modulator as an example of the present invention.

As shown in FIG. 1, first, a resist 102 was coated on an n-type (100) oriented InP substrate 101 and EB exposure was made in a <011> direction to form a diffraction grating resist pattern 104 only in the resist portion on the laser section 103 of the substrate 101. This diffraction grating resist pattern had an aperture length of 100 nm (constant) and aperture intervals of 241.7 nm (constant). (Since the wafer has a plurality of elements, the resist on the wafer is a repetition of a flat part of 400 $\mu$m in length and a diffraction grating part of 1,000 $\mu$m in length.) In this case, the width of each aperture of resist pattern was changed from 10 $\mu$m to 5 $\mu$m in the distance of 5 $\mu$m ranging from the end 105 of diffraction grating formation region toward the inner part 106. In this present example, the aperture width was increased linearly toward the end 105 of diffraction grating formation region from the inner part. As a result, the area of each aperture was increased linearly as well. The aperture width was changed in the distance of 5 $\mu$m ranging from the end of diffraction grating formation region toward the inner part 106 and was made constant (5 $\mu$m) in the further inner part. The reason why the aperture width was made constant in the further inner part is that the increase in etching rate due to pattern effect can be neglected in the further inner part. In this present example, the distance of the pattern effect was set at 5 $\mu$m ranging from the end 105 of diffraction grating formation region toward the inner part 106; however, since the distance differs depending upon the design of diffraction grating, the distance is not restricted to 5 $\mu$m and can be determined appropriately. In this present example, the aperture width was changed linearly; however, it can be increased from the inner part 106 toward the end 105 of diffraction grating formation region in the form of quadratic function, cubic function, n-order function or the like, or exponentially. Incidentally, the function can be appropriately determined so that the diffraction grating can have a constant depth.

Figure 2:
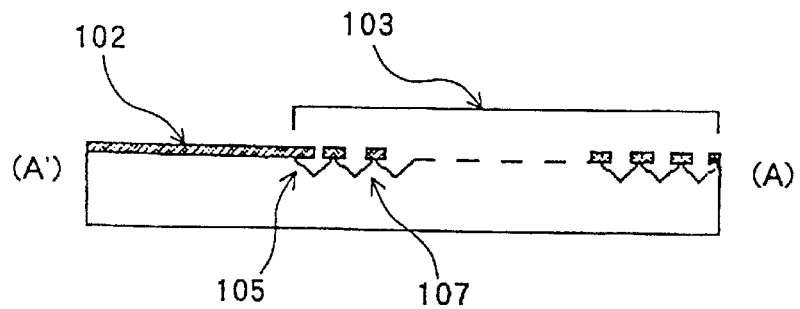
FIG. 2 is a drawing showing a step employed in production of a DFB laser with a field absorption type modulator as an example of the present invention.
Figure 3:
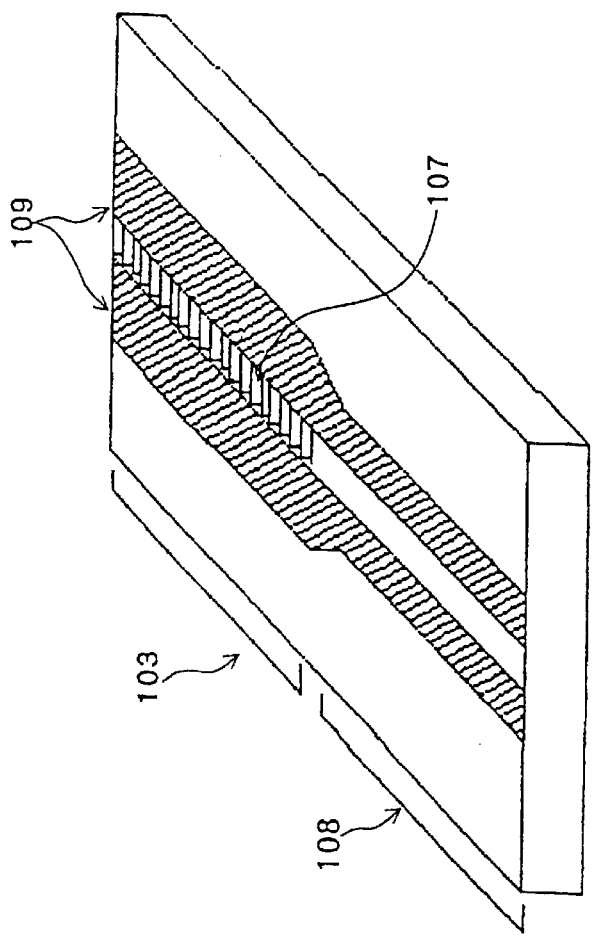
FIG. 3 is a drawing showing a step employed in production of a DFB laser with a field absorption type modulator as an example of the present invention.
Figure 4:
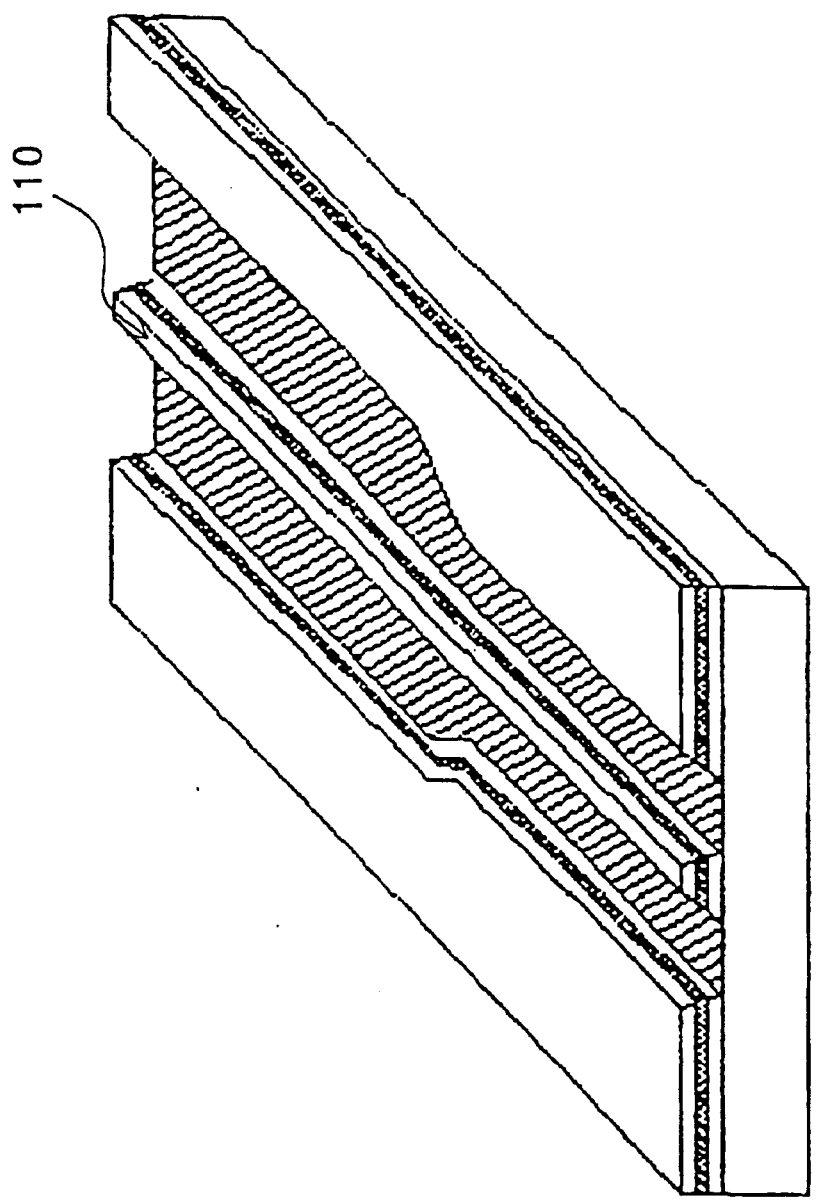
FIG. 4 is a drawing showing a step employed in production of a DFB laser with a field absorption type modulator as an example of the present invention.
Figure 5:
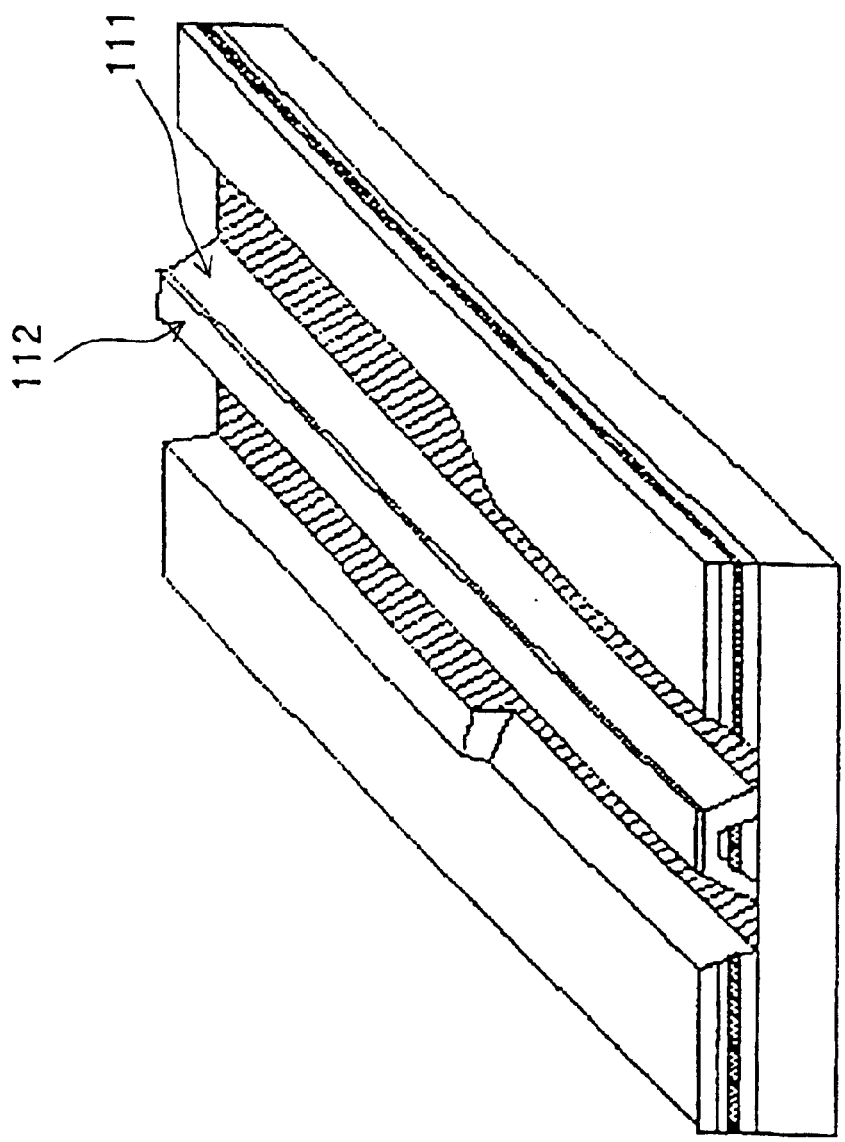
FIG. 5 is a drawing showing a step employed in production of a DFB laser with a field absorption type modulator as an example of the present invention.
Figure 6:
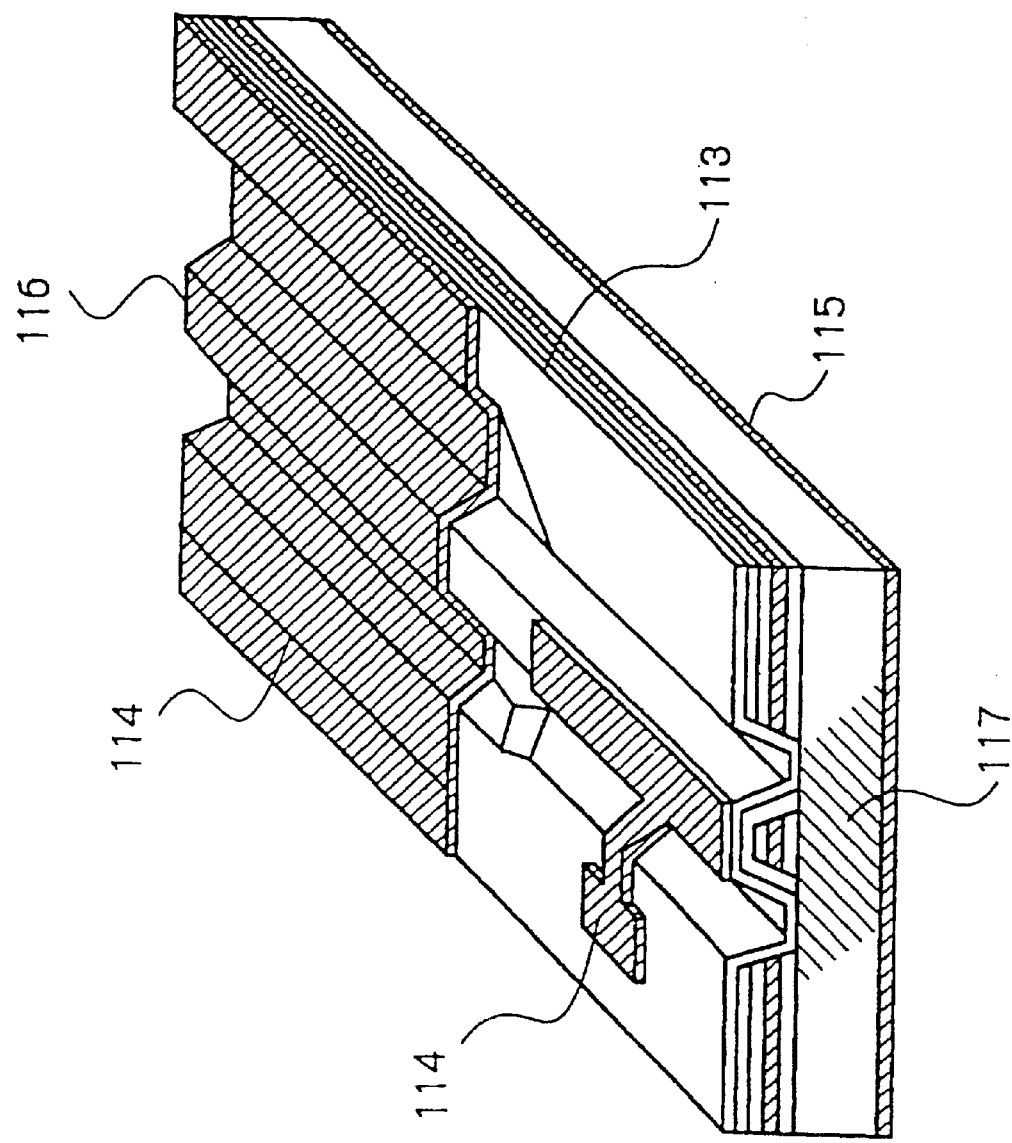
FIG. 6 is a drawing showing a step employed in production of a DFB laser with a field absorption type modulator as an example of the present invention.

Next, wet etching was conducted to form a diffraction grating. FIG. 2 shows a sectional view of FIG. 1 along the A–A' line after wet etching was conducted. Any other etching is also possible as long as effective etching can be made. In this present example, using an etching solution consisting of hydrogen bromide, hydrogen peroxide and water, the diffraction grating resist pattern 104 was transferred onto the InP substrate to form a diffraction grating 107. Then, the resist was removed, whereby was completed a diffraction grating substrate for a semiconductor laser partially having a diffraction grating. Then, as shown in FIG. 3, $SiO_2$ was deposited on the diffraction grating substrate in a thickness of 150 nm by thermal CVD, after which ordinary photolithography and wet etching were conducted to form a pair of stripe patterns (i.e. a growth checking mask 109) having a gap of 1.5 $\mu$m in a <011> direction, a width of 18 $\mu$m and a length of 500 $\mu$m at the laser section 103 and a width of 5 $\mu$m and a length of 200 $\mu$m at the modulator section 108. Then, as shown in FIG. 4, selective MOVPE (metal organic vapor phase epitaxy) was conducted at a growth pressure of 75 Torr and a growth temperature of 625° C. to form, in order, an InGaAsP guide layer having a thickness of 0.1 $\mu$m, a carrier concentration of $5\times10^{17}$ cm$^{-3}$ and a band gap wavelength of 1.13 $\mu$m; an MQW (multi quantum well) active layer wherein a 0.5% strained InGaAsP well of 6 nm in thickness (whose band gap wavelength composition was 1.56 $\mu$m at the laser section) and a barrier layer having a band gap wavelength of 1.13 $\mu$m were repeated 8 times; an InGaAsP optical confine layer having a thickness of 60 nm, a carrier concentration of $5\times10^{17}$ cm$^{-3}$ and a band gap wavelength of 1.13 $\mu$m; and a p-InP clad layer having a thickness of 0.1 $\mu$m and a carrier concentration of $5\times10^{17}$ cm$^{-3}$, whereby a waveguide mesa 110 was formed. In this case, the band gap wavelength of the MQW layer at the modulator section was 1.47 $\mu$m. Next, the aperture gap of the growth checking mask was widened to 7 $\mu$m by ordinary photolithography and wet etching. Then, as shown in FIG. 5, selective MOVPE was conducted at a growth pressure of 75 Torr and a growth temperature of 625° C. to form, in order, a buried layer 111 consisting of a p-InP layer having a thickness of 0.3 $\mu$m and a carrier concentration of $5\times10^{17}$ cm$^{-3}$ and a p-InP layer having a thickness of 1.5 $\mu$m and a carrier concentration of $1\times10^{18}$ cm$^{-3}$, and an InGaAsP cap layer 112 having a thickness of 0.2 $\mu$m and a carrier concentration of $5\times10^{18}$ cm$^{-3}$. Then, $SiO_2$ 113 was deposited in a thickness of 350 nm; ordinary photolithography and wet etching were conducted to form contact apertures; Ti and Au were deposited by sputtering in thicknesses of 100 nm and 300 nm, respectively; ordinary photolithography and wet etching were conducted to form a p-side electrode 114 of pad structure in each of the modulator section and the laser section; then, the back side of the wafer was polished to 100 $\mu$m, and Ti and Au (to later become an n-side electrode 115) were deposited on the backside in thicknesses of 100 nm and 300 nm, respectively, by sputtering, followed by sintering in an $N_2$ atmosphere. Lastly, the resulting material was cleaved at the boundary of the laser section and the modulator section; at the end face of the laser side was formed a high-reflection film 116 having a reflectivity of 90%, and at the end face of the modulator side was formed a low-reflection film 117 having a reflectivity of 0.1%; thereby, an element as shown in FIG. 6 was completed.

Thus, by forming a diffraction grating resist pattern 104 so that the aperture width gradually increased in the vicinity of the end 105 of diffraction grating formation region, a diffraction grating 107 having a uniform shape was formed at the laser section 103. Thereby, a pattern effect (that is, etching rate is larger in the vicinity of the end 105 of diffraction grating formation region during wet etching) could be prevented and overetched hollowing of diffraction grating could be suppressed. As a result, no discontinuity of waveguide was observed. Therefore, at the boundary of the diffraction grating formation region and the flat region, reduction in single-mode yield due to light reflection caused by discontinuity of waveguide was prevented and coupling loss between laser section and modulator section caused by light scattering was prevented. The element produced by the present example was evaluated, which indicated a good single-mode yield of laser oscillation spectrum of 70% (this was almost equal to the theoretical value anticipated from the randomness of end face phase). Further, the optical coupling between DFB laser section and modulator section was nearly 100%. Furthermore, the oscillation threshold of laser was 8 mA, the light output at 100 mA was 10 mW, and the extinction ratio (when a reverse bias voltage of 2 V was applied to the modulator) was 15 dB or more, which were almost equal to conventional levels. Moreover, a good penalty of 1 dB or less was obtained in a transmission test using a modulation speed of 2.5 Gb/s and a normal fiber of 150 km.

EXAMPLE 2

Steps for production of a laser partially having a diffraction grating, for analog transmission as an example of the present invention are shown in FIGS. 7 to 12.

Figure 7:
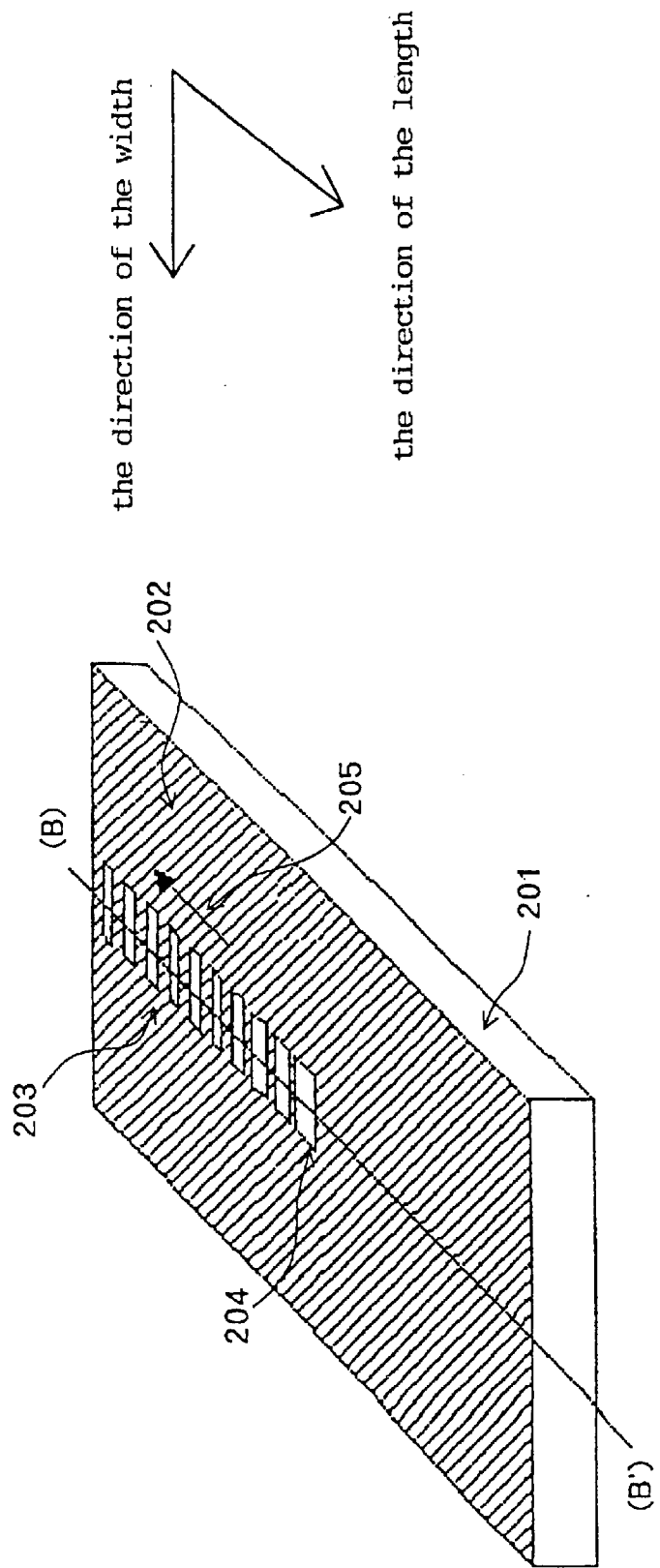
FIG. 7 is a drawing showing a step employed in production of a laser partially having a diffraction grating, for analog transmission, as an example of the present invention.

As shown in FIG. 7, first, a resist 202 was coated on an n-type (100) oriented InP substrate 201 and EB exposure was made in a <011> direction to form a diffraction grating resist pattern 203 in a length of 100 μm of the element length of 300 μm. The diffraction grating resist pattern had an aperture width of 5 μm (constant) and aperture intervals of 202.7 nm (constant), and a diffraction grating pattern section of 100μm in length and a flat section of 200μm in length were repeated on the wafer. In this case, the length of each aperture of resist pattern was changed from 150 nm to 50 nm in the distance of 3 μm ranging from the end 204 of diffraction grating formation region toward the inner part 205. In this present example, the aperture length was increased linearly toward the end 204 of diffraction grating formation region from the inner part. As a result, the aperture area was linearly increased as well. The aperture length was changed in the distance of 3 μm ranging from the end 204 of diffraction grating formation region toward the inner part 205 and was made constant (50 nm) in the further inner part. The reason why the aperture length was made constant in the further inner part, is that as in the case of example 1, the pattern effect can be neglected in the further inner part. The distance in which the aperture length is changed, differs and is appropriately selected depending upon the design of diffraction grating pattern as in example 1. In this present example, the aperture length was changed linearly; however, it can be increased from the inner part toward the end 204 of diffraction grating formation region in the form of quadratic function, cubic function, n-order function or the like, or exponentially. Incidentally, the function can be appropriately determined so that the diffraction grating can have a constant depth.

Figure 8:
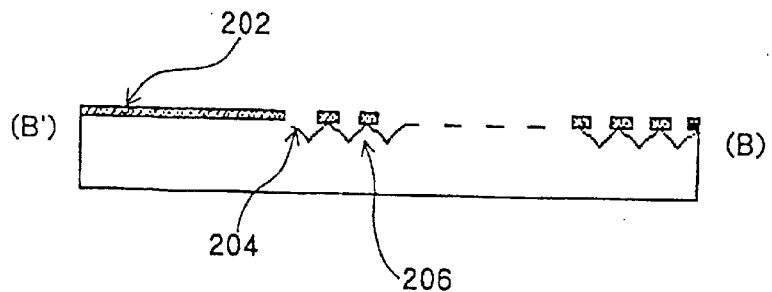
FIG. 8 is a drawing showing a step employed in production of a laser partially having a diffraction grating, for analog transmission, as an example of the present invention.
Figure 9:
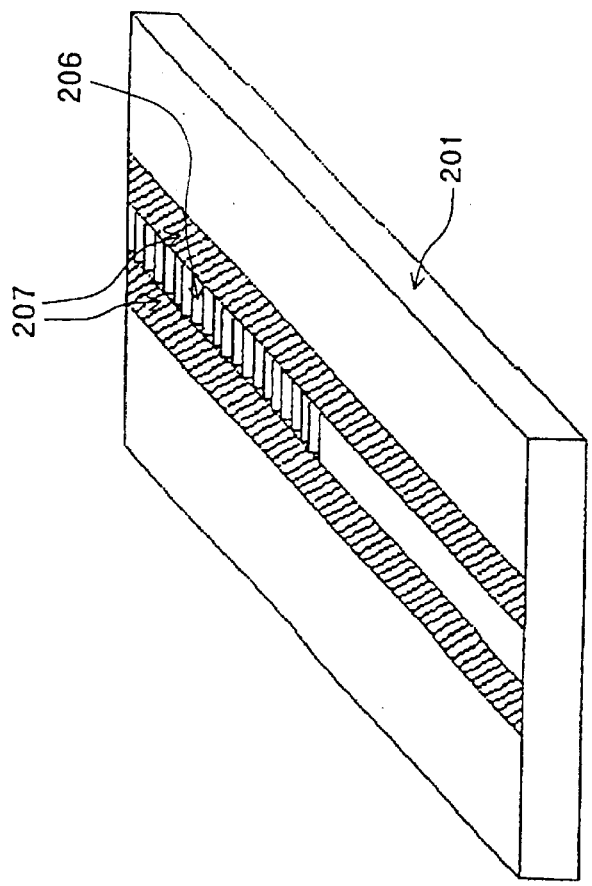
FIG. 9 is a drawing showing a step employed in production of a laser partially having a diffraction grating, for analog transmission, as an example of the present invention.

Next, wet etching was conducted to form a diffraction grating. FIG. 8 shows a sectional view of FIG. 7 along the B–B' line after wet etching was conducted. Any other etching is also possible as long as effective etching can be made. In this present example, using an etching solution consisting of hydrogen bromide, hydrogen peroxide and water, the diffraction grating resist pattern 203 was transferred onto the InP substrate to form a diffraction grating 206. Then, the resist was removed, whereby was completed a diffraction grating substrate for a semiconductor laser partially having a diffraction grating. As shown in FIG. 9, on this substrate was deposited $SiO_2$ in a thickness of 150 nm by thermal CVD, after which ordinary photolithography and wet etching were conducted to form a pair of stripe patterns having a gap of 1.5 μm in a <011> direction and a width of 3 μm, whereby a growth checking mask 207 was formed.

Figure 10:
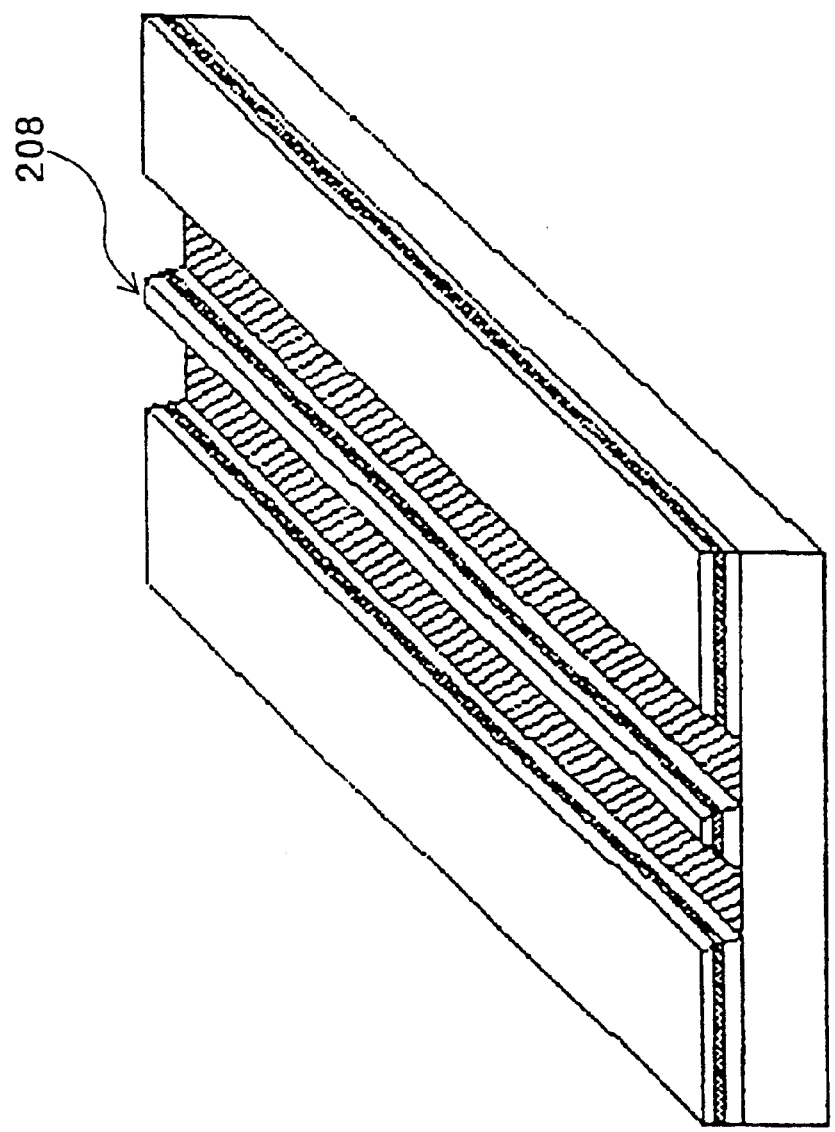
FIG. 10 is a drawing showing a step employed in production of a laser partially having a diffraction grating, for analog transmission, as an example of the present invention.
Figure 11:
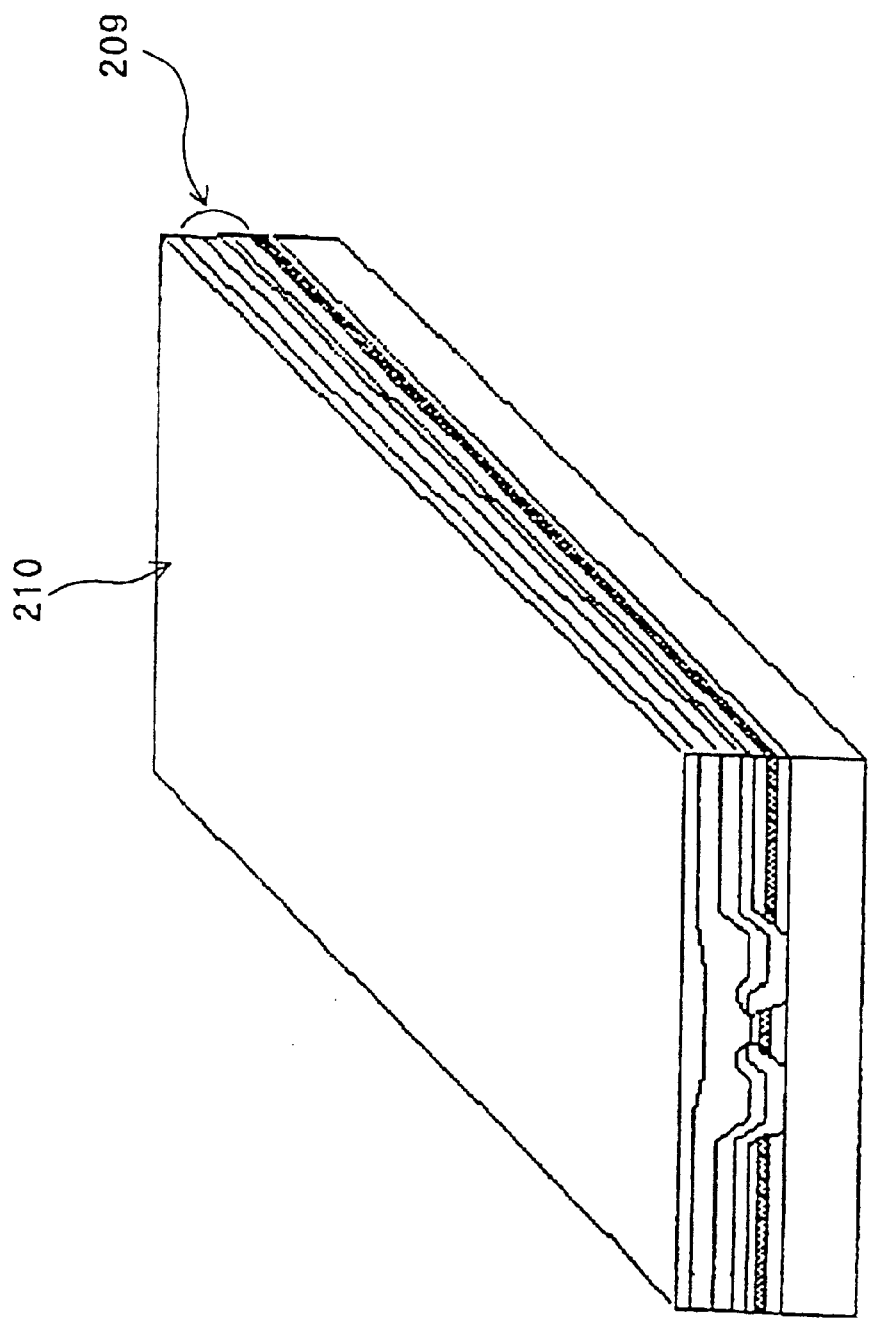
FIG. 11 is a drawing showing a step employed in production of a laser partially having a diffraction grating, for analog transmission, as an example of the present invention.
Figure 12:
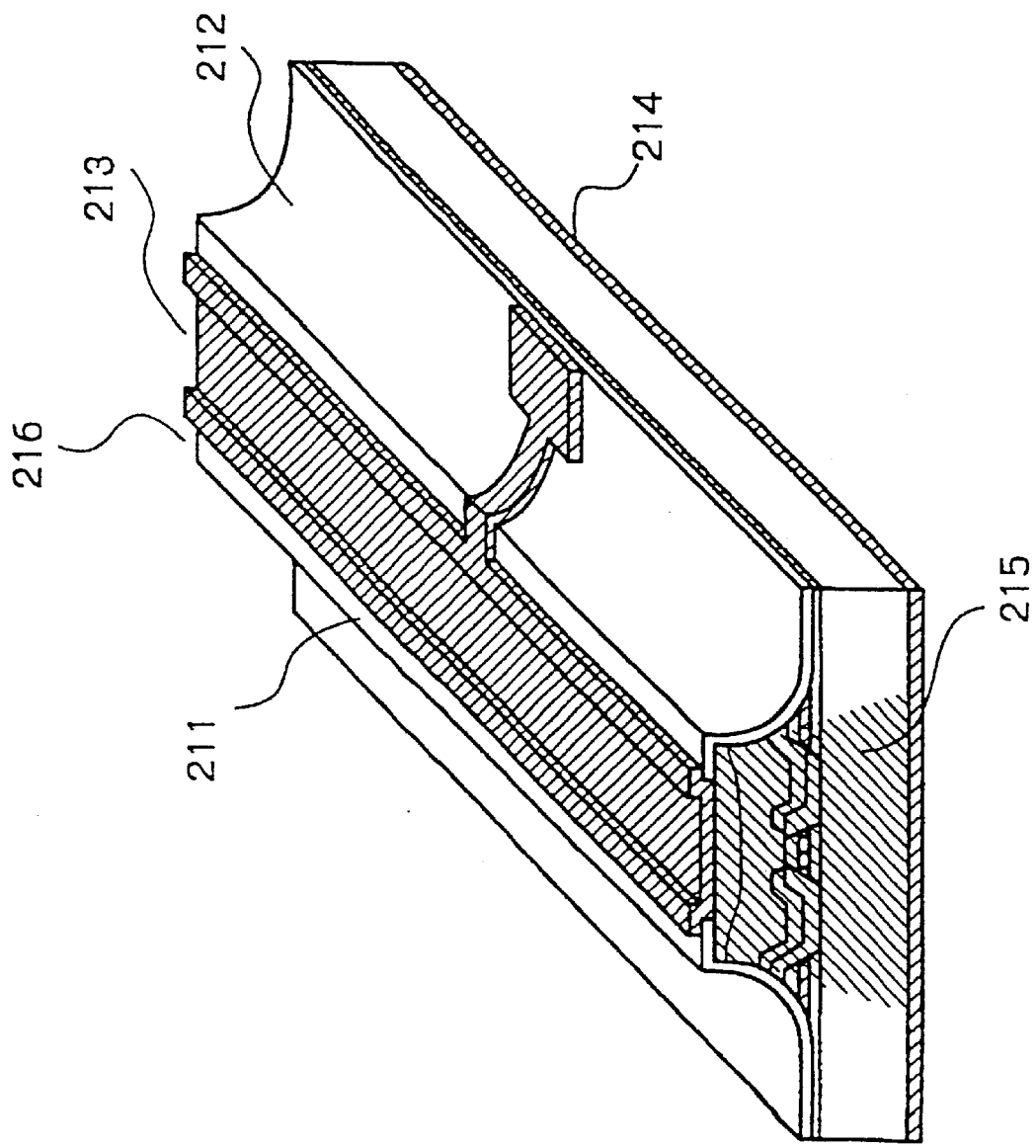
FIG. 12 is a drawing showing a step employed in production of a laser partially having a diffraction grating, for analog transmission, as an example of the present invention.
Figure 13:
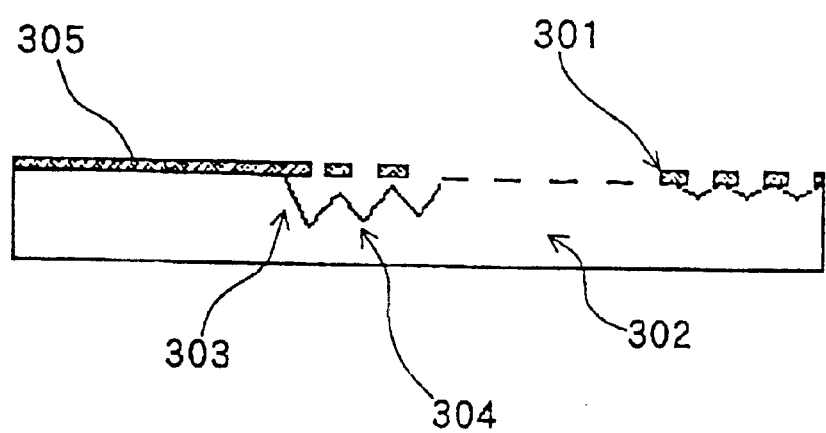
FIG. 13 is a drawing showing the overetched hollowing of diffraction grating seen in a diffraction grating substrate for semiconductor laser, produced by a conventional process.

Next, as shown in FIG. 10, selective MOVPE was conducted at a growth pressure of 75 Torr and a growth temperature of 625° C. to form, in order, an InGaAsP guide layer having a thickness of 0.1 μm, a carrier concentration of $1\times10^{18}$ cm$^{-3}$ and a band gap wavelength of 1.05 μm; an InP spacer layer having a thickness of 0.02 μm and a carrier concentration of $1\times10^{18}$ cm$^{-3}$; a non-doped MQW active layer wherein a 0.7% strained InGaAsP well of 5 nm in thickness (whose band gap wavelength composition was 1.31 μm) and a barrier layer having a thickness of 10 nm and a band gap wavelength of 1.05 μm were repeated 7 times; a non-doped InGaAsP optical confine layer having a thickness of 90 nm and a band gap wavelength of 1.05 μm; and a p-InP clad layer having a thickness of 0.1 m and a carrier concentration of $5\times10^{17}$ cm$^{-3}$, whereby a waveguide mesa 208 was formed. Next, $SiO_2$ was deposited on the whole wafer surface in a thickness of 350 nm, followed by photolithography and wet etching to form a $SiO_2$ pattern on the mesa. Next, selective MOVPE was conducted at a growth pressure of 75 Torr and a growth temperature of 625° C. to form, in order, a p-InP layer having a thickness of 0.3 μm and a carrier concentration of $5\times10^{17}$ cm$^{-3}$, an n-InP layer having a thickness of 1 μm and a carrier concentration of $1\times10^{18}$ cm$^{-3}$, and a p-InP layer having a thickness of 0.2 μm and a carrier concentration of $5\times10^{17}$ cm$^{-3}$. The $SiO_2$ mask was removed. Then, as shown in FIG. 11, MOVPE was conducted at a growth pressure of 75 Torr and a growth temperature of 625° C. to form a p-InP layer having a thickness of 1.5 μm and a carrier concentration of $1\times10^{18}$ cm$^{-3}$, whereby a current-blocking layer 209 of thyristor structure was obtained; thereon was formed an InGaAs cap layer 210 having a thickness of 0.2 μm and a carrier concentration of $5\times10^{18}$ cm$^{-3}$. Next, ordinary photolithography and wet etching were conducted to from a mesa stripe 211 having a width of 10 μm. Then, $SiO_2$ 212 was deposited in a thickness of 350 nm; ordinary photolithography and wet etching were conducted to form contact apertures; Ti and Au were deposited by sputtering in thicknesses of 100 nm and 300 nm, respectively; ordinary photolithography and wet etching were conducted to form a p-side electrode 213 of pad structure; then, the back side of the wafer was polished to 90 μm, and Ti and Au (to later become an n-side electrode 214) were deposited on the backside in thicknesses of 100 nm and 300 nm, respectively, by sputtering, followed by sintering in an $N_2$ atmosphere. Lastly, the resulting material was cleaved at the boundary of the diffraction grating formation region and the flat region; at the end face of the flat region was formed a high-reflection film 215 having a reflectivity of 70%, and at the end face of the diffraction grating formation region was formed a low-reflection film 216 having a reflectivity of 1%; thereby, an element as shown in FIG. 12 was completed.

Thus, by gradually increasing the aperture length of diffraction grating pattern 203 in the vicinity of the end 204 of diffraction grating formation region, an increase in etching rate and consequent overetched hollowing of diffraction grating (which appear in the vicinity of the end 204 of diffraction grating formation region owing to a pattern effect during wet etching) were prevented, whereby a diffraction grating 206 having a uniform shape was formed. As a result, there was no discontinuity of waveguide. Therefore, light reflection and scattering at the end 204 of diffraction grating, caused by discontinuity of waveguide were suppressed, and there was sufficiently obtained the performance (i.e. uniform field distribution in waveguide direction and good analog property) to be possessed by a DFB laser partially having a diffraction grating. The laser obtained by the present example was evaluated for analog property, which indicated a secondary intermodulation distortion of −65 dB (an improvement of 10 dB or more over conventional levels) at a light output of 30 mW. Further, the oscillation threshold was 10 mA and the slope efficiency was 0.58 W/A, and the static properties were about equal to conventional levels.

What is claimed is:

1. A process for producing a diffraction grating substrate for a semiconductor laser partially having a diffraction grating, which process comprises:

a resist patterning step of forming a resist pattern for formation of diffraction grating on a semiconductor substrate so that the aperture area of diffraction grating increases gradually toward the end of diffraction grating formation region, the resist pattern being formed so that each aperture has a constant length but its area is increased gradually by gradually increasing its width, and an etching step of conducting etching using said resist pattern to form a diffraction grating at the surface of the semiconductor substrate.

2. A process according to claim 1, wherein the resist patterning step is a step of forming a pattern on a resist using an electron beam.

3. A process according to claim 1, wherein in the etching step the etching is conducted by wet etching.

4. A process for producing a semiconductor laser partially having a diffraction grating, which comprises a step of forming, on the diffraction grating substrate produced by the process set forth in claim 1, a guide layer, an active layer and a clad layer in this order.

5. A process for producing a diffraction grating substrate for a semiconductor laser partially having a diffraction grating, which process comprises:

a resist patterning step of forming a resist pattern for formation of diffraction grating on a semiconductor substrate so that the aperture area of diffraction grating increases gradually toward the end of diffraction grating formation region, and an etching step of conducting wet etching using said resist pattern to form a diffraction grating at the surface of the semiconductor substrate.

6. A process according to claim 5, wherein in the resist patterning step the resist pattern is formed so that each aperture has a constant length but its area is increased gradually by gradually increasing its width.

7. A process according to claim 5, wherein in the resist patterning step the resist pattern is formed so that each aperture has a constant width but its area is increased gradually by gradually increasing its length.

8. A process according to claim 5, wherein the resist patterning step is a step of forming a pattern on a resist using an electron beam.

9. A process for producing a semiconductor laser partially having a diffraction grating, which comprises a step of forming, on the diffraction grating substrate produced by the process set forth in claim 5, a guide layer, an active layer and a clad layer in this order.

10. A process for producing a diffraction grating substrate for a semiconductor laser partially having a diffraction grating, which process comprises:

a resist patterning step of forming a resist pattern for formation of diffraction grating on a semiconductor substrate so that the aperture area of diffraction grating increases gradually toward the end of diffraction grating formation region; and an etching step of conducting etching using said resist pattern to form a diffraction grating at the surface of the semiconductor substrate;

wherein the resist patterning and etching steps are performed so as to produce a diffraction grating having a constant depth.

11. The process of claim 10, wherein in the resist patterning step the resist pattern is formed so that each aperture has a constant length but its area is increased gradually by gradually increasing its width.

12. The process of claim 10, wherein in the resist patterning step the resist pattern is formed so that each aperture has a constant width but its area is increased gradually by gradually increasing its length.

13. The process of claim 10, wherein the resist patterning step is a step of forming a pattern on a resist using an electron beam.

14. The process of claim 10, wherein the etching is wet etching.

* * * * *